US007910450B2

(12) United States Patent
Chinthakindi et al.

(10) Patent No.: US 7,910,450 B2
(45) Date of Patent: Mar. 22, 2011

(54) METHOD OF FABRICATING A PRECISION BURIED RESISTOR

(75) Inventors: Anil K. Chinthakindi, Poughkeepsie, NY (US); Douglas D. Coolbaugh, Essex Junction, VT (US); Keith E. Downes, Stowe, VT (US); Ebenezer E. Eshun, Newburgh, NY (US); John E. Florkey, Centerville, OH (US); Heidi L. Greer, Essex Junction, VT (US); Robert M. Rassel, Colchester, VT (US); Anthony K. Stamper, Williston, VT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 627 days.

(21) Appl. No.: 11/276,282

(22) Filed: Feb. 22, 2006

(65) Prior Publication Data

US 2006/0108645 A1 May 25, 2006
US 2007/0194390 A1 Aug. 23, 2007

(51) Int. Cl.
*H01L 21/20* (2006.01)
(52) U.S. Cl. ................. 438/382; 257/543; 257/E27.016
(58) Field of Classification Search .................. 257/379, 257/543, 577, E29.016; 438/210, 238, 382
See application file for complete search history.

(56) References Cited

U.S. PATENT DOCUMENTS

| 4,228,450 | A | * | 10/1980 | Anantha et al. | ................. 257/540 |
| 4,418,469 | A | | 12/1983 | Fujita | |
| 4,544,937 | A | * | 10/1985 | Kroger | ............................. 257/36 |
| 4,560,583 | A | | 12/1985 | Moksvold | |
| 5,114,868 | A | * | 5/1992 | Yoshida | .......................... 438/442 |
| 5,286,670 | A | * | 2/1994 | Kang et al. | ..................... 438/155 |
| 5,302,534 | A | * | 4/1994 | Monk et al. | ..................... 438/234 |
| 5,308,776 | A | * | 5/1994 | Gotou | ............................. 438/311 |
| 5,506,528 | A | * | 4/1996 | Cao et al. | ....................... 327/108 |
| 5,994,759 | A | | 11/1999 | Darmawan et al. | |
| 6,057,204 | A | | 5/2000 | Nowak et al. | |
| 6,180,478 | B1 | * | 1/2001 | Lee et al. | ...................... 438/309 |

(Continued)

FOREIGN PATENT DOCUMENTS

JP 63086565 A * 4/1988

OTHER PUBLICATIONS

Seidel et al. ("Buried-Guarded Layer Ion-Implanted Resistors", IEEE Transactions on Electron Devices, vol. ED-20, No. 8, Aug. 1973).*
Thomas E. Seidel et al., "Buried-Guarded Layer Ion-Implanted Resistors", IEEE Translations on Electron Device 3, vol., ED-20, No. 8, Aug. 31, 1973.

(Continued)

*Primary Examiner* — Thao X Le
*Assistant Examiner* — William F Kraig
(74) *Attorney, Agent, or Firm* — Scully, Scott, Murphy & Presser, P.C.; David Cain, Esq.

(57) ABSTRACT

The present invention provides a semiconductor structure including a buried resistor with improved control, in which the resistor is fabricated in a region of a semiconductor substrate beneath a well region that is also present in the substrate. In accordance with the present invention, the inventive structure includes a semiconductor substrate containing at least a well region; and a buried resistor located in a region of the semiconductor substrate that is beneath said well region. The present invention also provides a method of fabricating such a structure in which a deep ion implantation process is used to form the buried resistor and a shallower ion implantation process is used in forming the well region.

10 Claims, 12 Drawing Sheets

U.S. PATENT DOCUMENTS

| | | |
|---|---|---|
| 6,265,248 B1 | 7/2001 | Darmawan et al. |
| 6,274,422 B1 * | 8/2001 | Wakita .......................... 438/238 |
| 6,300,668 B2 | 10/2001 | Miller, Jr. et al. |
| 6,690,082 B2 | 2/2004 | Lakshmikumar |
| 6,693,325 B1 * | 2/2004 | Ko et al. ...................... 257/347 |

OTHER PUBLICATIONS

Chinese Office Action dated Oct. 9, 2009.

* cited by examiner

METHOD OF FABRICATING A PRECISION BURIED RESISTOR

FIELD OF THE INVENTION

The present invention relates to semiconductor device fabrication, and more particularly to a method of fabricating a precision buried resistor with improved sheet resistance control. The present invention is also related to a semiconductor structure in which the precision buried resistor is present in a region of a semiconductor substrate that is located beneath a well region, which is also present in the semiconductor substrate.

BACKGROUND OF THE INVENTION

A buried resistor is a standard element in bi-complementary metal oxide semiconductor (biCMOS) technologies. A typical buried resistor consists, for example, of an n+ doped region in a p-type substrate (or p-well) or a p+ doped region in an n-type substrate (or n-well).

Another type of resistor used in certain integrated circuit (IC) technologies is polysilicon on a thick oxide structure that provides lower capacitance to the substrate. These resistors, which are sometimes referred to as polySi resistors, can also be built over an n-well or p-well, for example. However, polySi resistors are not generally compatible with CMOS technologies which do not offer a blocked silicidation process feature. Furthermore, buried resistors have a much greater heat dissipation capability and are less expensive to manufacture, thus generally more desirable for many applications.

Although buried resistors are widely used in biCMOS circuit designs, such resistors typically carry low currents (on the order of about 1 mA-µm or less) which greatly limits their use. Moreover, prior art buried resistors have a sheet resistance tolerance that is greater than 10% and, as such, no precision buried resistor design is presently available.

In view of the above drawbacks with prior art buried resistors, there is a need for providing a buried resistor that is capable of carrying high currents (on the order of about 1 mA-µm or greater) and which has a sheet resistance tolerance of less than 10%. That is, a precision buried resistor is needed that has an improved sheet resistance control.

SUMMARY OF THE INVENTION

The present invention relates to a semiconductor structure having a buried resistor with improved control, in which the resistor is located in a region of a semiconductor substrate beneath a well region that is also present in the substrate. By 'improved control' it is meant that the buried resistor of the present invention has a sheet resistance tolerance of less than 10%.

In general terms, the present invention provides a semiconductor structure which comprises:

a semiconductor substrate including at least a well region; and a buried resistor located in a region of said semiconductor substrate that is beneath said well region, said buried resistor has a sheet resistance tolerance of less than 10%.

In accordance with one embodiment of the present invention, a buried resistor of a first conductivity type can be disposed into a substrate of a second, opposite conductivity type. In another embodiment of the present invention, a buried resistor of a first conductivity type is disposed in a substrate of the same first conductivity type. That is, the present invention contemplates embodiments wherein the buried resistor can be fabricated to have the same or different polarity as that of the substrate. In either of the two embodiments mentioned above, the semiconductor substrate can be a bulk substrate, with or without an epitaxial overlayer, or a semiconductor-on-insulator (SOI) substrate.

The present invention contemplates embodiments where the well region contacts at least one portion of the buried resistor. In a highly preferred embodiment of the present invention, well regions of similar conductivity type are positioned and are in contact with end portions of the buried resistor. The present invention also contemplates an embodiment in which the opposite polarity well region is located across an entire length of the buried resistor. In yet other embodiments, the well region is positioned within a top semiconductor layer of an SOI substrate and the buried resistor is positioned within a bottom semiconductor layer of the SOI substrate. In such an embodiment, the well region is isolated from the buried resistor by the buried insulating layer of the SOI substrate.

In some embodiments of the present invention and where the buried resistor has a high dopant concentration (on the order of about $10^{20}$ atoms/cm$^3$), the buried resistor can be used as a bottom electrode plate of a metal-insulator-metal (MIM) capacitor. In such an embodiment, an MIM capacitor dielectric is located on an upper surface of the substrate including the buried resistor and the upper electrode plate is located on an upper surface of the MIM capacitor dielectric. In such a semiconductor structure, the well region is located in a semiconductor layer that overlays the MIM capacitor.

The semiconductor structure of the present invention can be integrated with various types of semiconductor devices including, for example, a field effect transistor, a bipolar transistor, or a combination thereof.

In addition to the semiconductor structure mentioned above, the present invention also relates to a method of fabricating the same. In general terms, the method of the present invention comprises:

forming a buried resistor beneath a surface of a semiconductor substrate; and forming a well region in said semiconductor substrate above said buried resistor, wherein said buried resistor has a sheet resistance tolerance of less than 10%.

In accordance with one embodiment of the present invention, a buried resistor of a first conductivity type can be disposed into a substrate of a second, opposite conductivity type. In another embodiment of the present invention, a buried resistor of a first conductivity type is disposed in a substrate of the same first conductivity type. In either of the two embodiments mentioned above, the semiconductor substrate can be a bulk substrate, with or without an epitaxial overlayer, or a semiconductor-on-insulator (SOI) substrate. In yet another embodiment, the well region has the same polarity as that of the buried resistor.

It is noted that the term "well region" is used in the present application to denote a localized implanted region in a substrate where a semiconductor device such as a FET or a bipolar transistor can be constructed that is of opposite dopant type than the 'host' well. Given this definition, the term 'well region' also is intended to include a reachthough/sinker implant region of a bipolar transistor which tends to be used to contact the subcollectors of said device.

DETAILED DESCRIPTION OF THE INVENTION

Figure 1A:
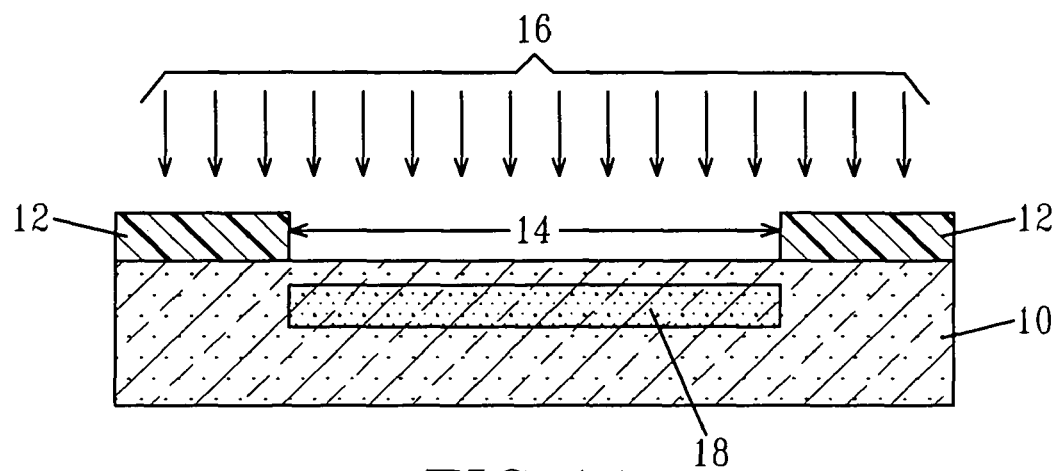
FIGS. 1A-1G are pictorial representations (through cross sectional views) illustrating a first embodiment of the present invention for fabricating a precision buried resistor of a first conductivity type in a bulk substrate of the opposite conductivity type.

The present invention, which provides a precision buried resistor having improved control as well as a method of fabricating the same, will now be described in greater detail by referring to the following discussion and drawings that accompany the present application. It is noted that the accompanying drawings are provided for illustrative purposes and, as such, the drawings are not drawn to scale.

As stated above, the present invention provides a precision buried resistor that is an improvement over conventional buried resistors. The improvement of the inventive buried resistor is manifested in one aspect by the inventive resistor's capability of carrying a higher current than prior art buried resistors. In particular, the inventive buried resistor can carry high currents on the order of about 1 mA-μm or greater. In addition to carrying higher currents than prior art buried resistors, the inventive resistor has a sheet resistance tolerance that is less than 10%. More typically, the inventive buried resistor has a sheet resistance tolerance from about 5 to about 10%. This means the sheet resistance value may vary from +/−5 to 10% during normal semiconductor processing of hardware. The sheet resistance tolerance is determined by implementing a statistical analysis on a large population of sheet resistance data and determining the tolerance (delta between the high and low spec limit from a target) required to provide a statistical Cp and Cpk value greater than 1.

In general terms, the present invention provides a semiconductor structure which includes a semiconductor substrate having at least a well region; and a buried resistor located in a region of the semiconductor substrate that is beneath the well region, wherein the buried resistor has a sheet resistance tolerance of less than 10%. In some embodiments, at least one portion of the well region is in contact with the buried resistor. In another embodiment of the present invention, the well region is not in direct contact with the buried resistor and is typically located in a top semiconductor layer of a semiconductor-on-insulator substrate.

The semiconductor structure is formed by first forming the buried resistor into a region of the substrate by ion implantation and then forming the well region therein. A deep ion implantation, relative to the well implant, is used in forming the buried resistor into the substrate such that it is located beneath the surface of the substrate. A shallower ion implant is then used in forming the well region in a region of the substrate that is above the buried resistor.

The above paragraphs provide a general description of the inventive structure and method, the following description provides more details regarding the inventive structure and various embodiments that can be used in fabricating the same.

EMBODIMENT I

Buried p- or n-Type Resistor in an n- or p-Type Substrate, Respectively

In this embodiment of the present invention, a buried resistor (p- or n-type) is formed into a semiconductor substrate (n- or p-type, e.g., opposite dopant type as that of the buried resistor) that includes a bulk semiconductor material and optionally an epitaxial semiconductor layer located on a surface of the bulk semiconductor material.

The term "semiconductor material or layer" is used throughout the present application to denote a material or layer that has semiconducting properties. Examples of such semiconducting materials or layers include, but are not limited to: Si, SiGe, SiGeC, SiC, Ge alloys, GaAs, InAs, InP and other II/V or III/VI compound semiconductors. Organic semiconductor materials are also contemplated herein. In some embodiments, a semiconductor-on-insulator including a buried insulating layer, such as a crystalline or non-crystalline oxide or nitride, separating a top semiconducting layer from a bottom semiconducting layer can be employed. Typically, the semiconductor material is a Si-containing semiconductor such as, for example, Si or SiGe. The semiconductor material may be strained or unstrained. Additionally, the semiconductor material or layer may have a single crystal orientation or it may contain regions that have different surface crystallographic orientations. The substrate is typically doped either n-type or p-type.

FIGS. 1A-1G are pictorial representations of the various processing steps used in this first embodiment of the present invention. The first embodiment of the present invention begins by forming a patterned ion implantation mask 12 on a surface of an initial semiconductor substrate 10 such that the patterned ion implantation mask 12 includes at least one opening 14 therein. The patterned ion implantation mask 12, which may comprise a conventional photoresist, a hard mask material such as an oxide, or a combination thereof, is formed by blanket deposition of at least one of the aforementioned mask materials on the surface of the initial substrate 10. Blanket deposition may be performed by spin-on coating, evaporation, chemical vapor deposition (CVD), plasma enhanced chemical vapor deposition (PECVD), chemical solution deposition or other like deposition processes. The blanket mask material typically has an as-deposited thickness range that is generally thick enough to prevent dopants from being implanted into the substrate 10. After blanket deposition, a conventional lithographic process is used to pattern the mask material. The conventional lithographic process includes exposing the mask material to a desired pattern of radiation and developing the mask material utilizing a conventional resist developer. In some embodiments in which the mask material includes a stack of a hard mask and a photoresist, an etching step (including a dry etching process, such as reactive-ion etching (RIE), ion beam etching, plasma etching or laser ablation, or a chemical wet etching process) can be used to provide the at least one opening 14 in the patterned ion implantation mask 12.

FIG. 1A also shows the formation of a buried resistor 18 into the substrate 10 by ion implanting dopant ions 16 of a first conductivity type (ions of the first conductivity type have a different polarity than the substrate). The first conductive type dopant ions 16 that can be used in forming the buried resistor 18 comprise either an n-type dopant such as, for example, an element from Group VA of the Periodic of Elements, or a p-type dopant, such as, for example, an element from Group IIIA of the Periodic Table of Elements. Preferably, P, As, or Sb are used as the n-type dopants, while B, Ga or In are used as the p-type dopants. It is noted that the buried resistor 18 in this embodiment of the present invention has a conductivity type that differs from that of the substrate 10.

The ion implantation process used in forming the buried resistor 18 is a deep ion implantation process relative to the ion implantation process that will be subsequently used in forming the well region. By "deep" it is meant that the ions used in forming the buried resistor 18 are implanted such that the upper surface of the buried resistor 18 is located about 40 nm or greater from the upper surface of the initial substrate 10. Typically, the upper surface of the buried resistor 18 is located from about 100 to about 1000 nm from the upper surface of the initial substrate 10.

The conditions for forming the buried resistor 18 into the substrate 10 vary depending upon the type of ions that are used. For p-type boron dopants, an energy from about 10 to about 1500 keV is utilized, with an energy from about 30 to about 400 keV being more typical. For n-type As dopants, an energy from about 50 keV or greater is utilized, with an energy from about 150 to about 1500 keV being more typical. It is noted that any dosage can be used in forming the buried resistor 18, with a dosage of about $10^{14}$ atoms/cm$^2$ or greater being typically used. It is noted that the ion implantation conditions used in forming the buried resistor 18 avoid significant damage to the semiconductor material that lays above the implanted buried resistor 18. This can be implemented by using lighter dopant ions such as, for example, B for p-type, and P for n-type, and also by limiting the dosage used especially for heavier atoms.

Figure 1B:
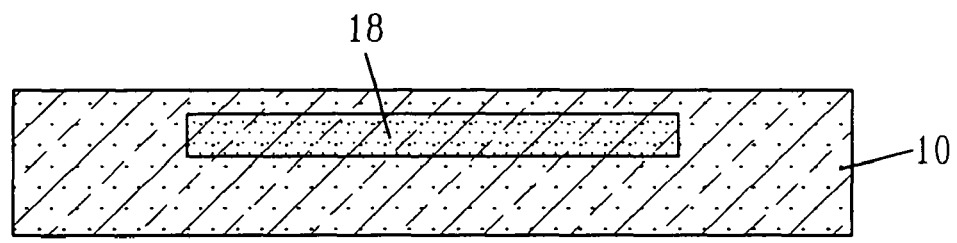

Following formation of the buried resistor 18, the patterned ion implantation mask 14 is removed from the surface of the initial substrate 10 utilizing a conventional resist stripping process providing the structure shown in FIG. 1B. Alternatively, a conventional planarization process such as, chemical mechanical polishing (CMP), can be employed. An anneal step, which is performed in an inert ambient such as He or Ar, is then performed to heal any damages that may have occurred in the previous ion implantation process. This anneal may also serve to activate the dopants within the buried resistor 18. Annealing is performed at a temperature of about 800° C. or greater, with a temperature from about 9000 to about 1200° C. being more typical. The anneal times vary depending on the type of annealing process used. The annealing process may include a furnace anneal, a rapid thermal anneal, a laser anneal, a spike anneal or microwave annealing. The resultant structure that is formed after removing the patterned ion implantation mask 14 and annealing is shown, for example, in FIG. 1B.

Figure 1C:
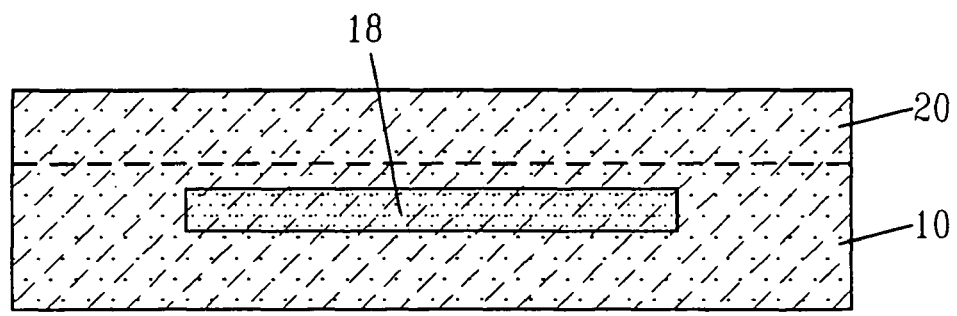

FIG. 1C shows an optional, but preferred embodiment, in which an epitaxial (e.g., epi) semiconductor layer 20 such as epi Si, is formed on the surface of the initial substrate 10. It is noted that layers 10 and 20 form a final semiconductor substrate in which both the buried resistor 18 and the well region will be present. In some embodiments, the initial substrate can also function as the final substrate so long as there is sufficient semiconductor material atop the buried resistor for forming the well region. The epitaxial semiconductor layer 20 is formed utilizing a conventional epitaxial process that is well known in the art. The epi layer 20 typically has a thickness from about 100 to about 2000 nm.

Figure 1D:
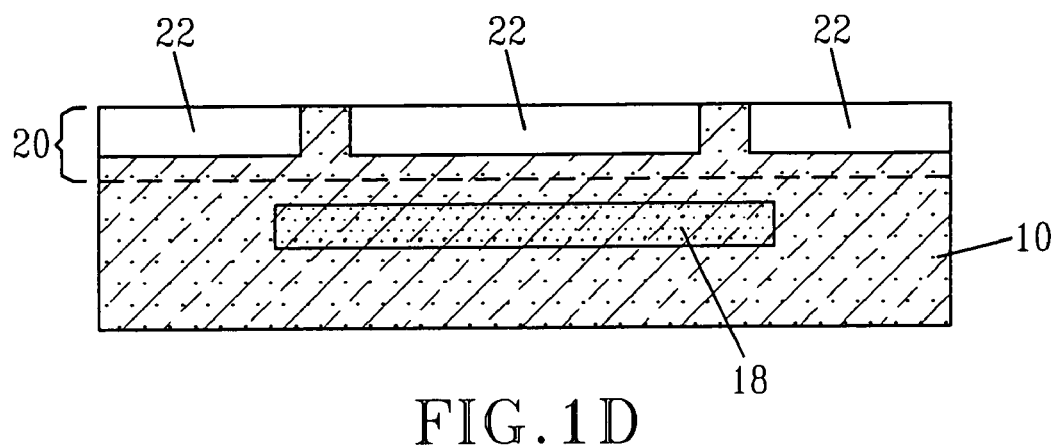

FIG. 1D shows the structure of FIG. 1C after forming isolation regions 22 into the final substrate (i.e., layer 10 or layers 10 and 20). In the particular embodiment illustrated, the isolation regions 22 are formed into the previous formed epi layer 20. The isolation regions 22 may comprise trench isolation regions formed by a conventional trench isolation process or local oxidation of silicon regions that are formed by a LOCOS (local oxidation of silicon) process.

Figure 1E:
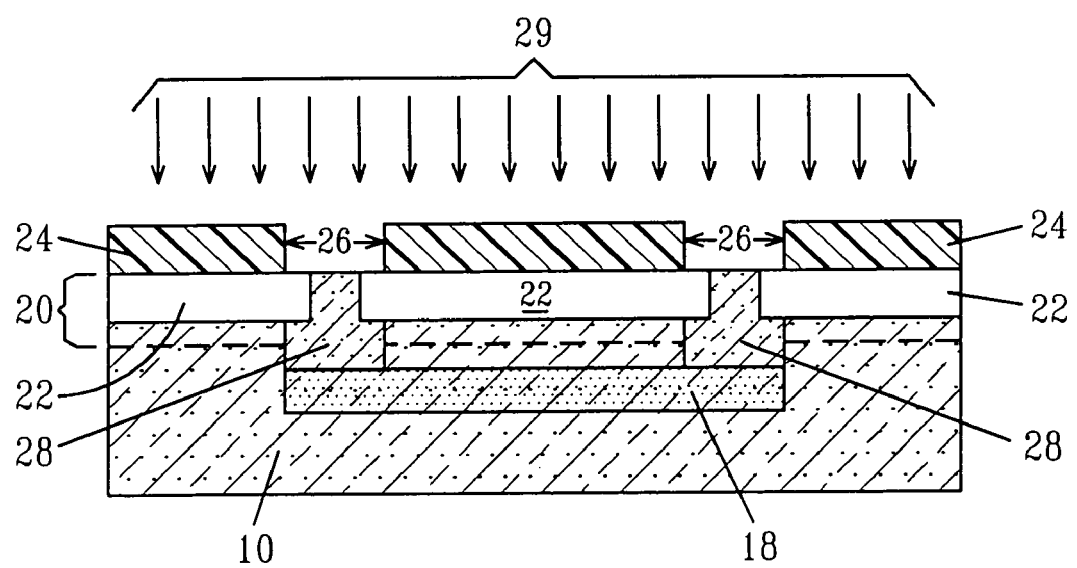

After forming the isolation regions 22, a patterned implantation mask 24 including at least one opening 26 is formed on the structure utilizing the processing described above in forming the first patterned mask 12. The resultant structure is shown in FIG. 1E. In FIG. 1E, the second patterned mask 24 includes two openings 26 which are located above end portions of the underlying buried resistor 18.

FIG. 1E also shows the formation of a well region 28 into the substrate by ion implanting dopant ions 29 of the first conductivity type which is similar to the conductivity type of that of the buried resistor 18. The first conductivity type dopant ions 29 that can be used in forming the well region 28 comprise either an n-type dopant such as, for example, an element from Group VA of the Periodic of Elements, or a p-type dopant, such as, for example, an element from Group IIIA of the Periodic Table of Elements. Preferably, P and As are used as the n-type dopants, while B, Ga or In are used as the p-type dopants.

The ion implantation process used in forming the well region 28 is a shallow ion implantation process relative to the ion implantation process that was used in forming the buried resistor 18. The well region 28 may be located entirely within the initial substrate 10 or a part thereof can be formed into the epi semiconductor layer 20, as shown. The well region 28 extends from at least one portion of the upper surface of the buried resistor 18 to the top surface of the final substrate (either 10 or layers 10 and 20). This well region can be the respective nFET or pFET well regions which are commonly referred to as p-well or n-well, respectively. Similarly these well regions can be the reachthrough/sinker implant regions used for a subcollector contact of a bipolar device.

The conditions for forming the well regions 28 into the final substrate (either 10 or layers 10 and 20) vary depending upon the type of ions that are used and can be derived from the standard and commonly known pFET or nFET well process or a bipolar reachthrough/sinker implant process. After removing the patterned ion implantation mask 24, and optional annealing step may be performed to activate the dopants within the well region 28. This anneal may be delayed and performed during thermal processing steps used in forming a FET and/or bipolar device.

In the embodiment shown in FIG. 1E, well regions 28 extend from end portions of the buried resistor 18. Thus, a low resistance electrical contact to the resistor's ends is provided, wherein the length of the resistor is the distance between the two well regions.

Figure 1F:
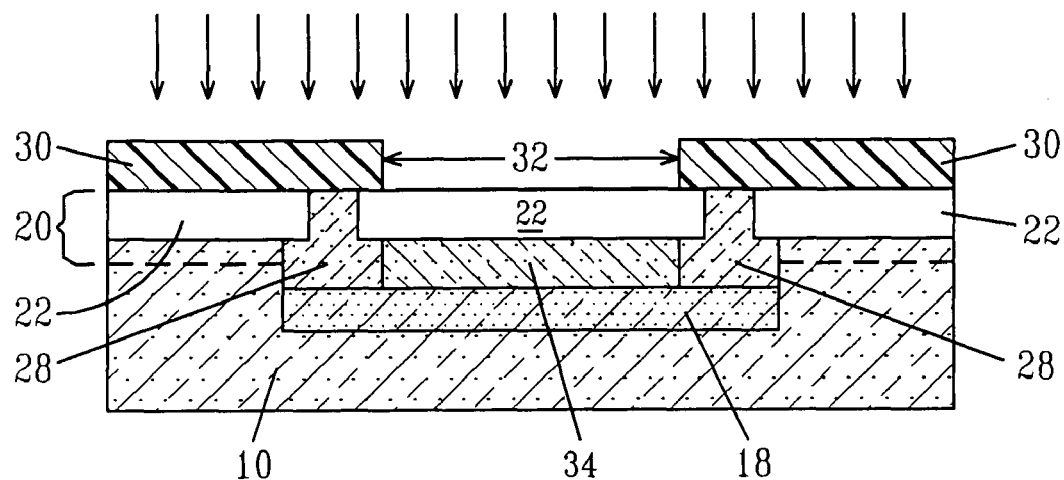

FIG. 1F shows an optional embodiment in which a third patterned mask 30 is formed having an opening 32 that exposes regions of the substrate (either 10 or layers 10 and 20) between the two well regions 28 shown in FIG. 1E. FIG. 1F also shows an additional well region implant of the opposite type as used in forming well regions 28 so as to provide a well region 34 of the opposite conductivity type between the two previously formed well regions 28. Thus, the structure shown in FIG. 1F has a well region (including well regions 28 and 34) which extends over the entire surface of the buried resistor 18. This well region 34 of opposite conductivity type of the buried resistor and reachthrough well region 28 is used to isolate the two distinct contacts from each end of the buried resistor 18.

Figure 1G:
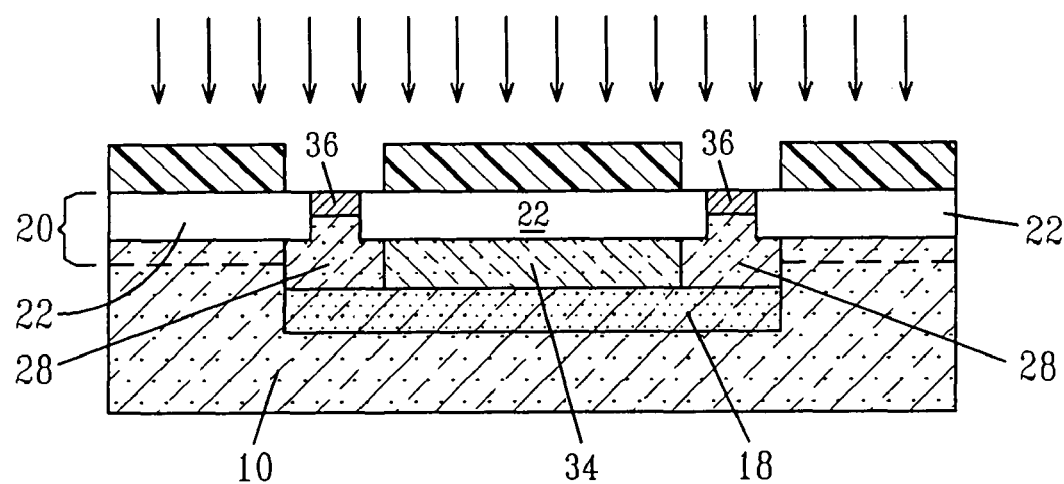

Conventional CMOS and/or bipolar processing can now be continued to form at least one semiconductor device such as, for example, a FET, a bipolar transistor or both, on the structure. In some embodiments, surface portions of the well region 28 which extend from the end portions of the buried resistor 18 are subjected to another masked implantation process such that contact regions 36 of the same conductivity type are formed therein. The resultant structure is shown in FIG. 1G. The contact regions 36 provide good ohmic contacts to the well regions 28 that are located at the ends of the buried resistor. The contact regions 36 can be formed by utilizing standard pFET or nFET source/drain ion implant process or the bipolar emitter ion implantation process.

EMBODIMENT II

Buried p- or n-Type Resistor in a p- or n-Type Substrate

In this embodiment of the present invention, a buried resistor (p- or n-type) is formed into a semiconductor substrate (p- or n-type, e.g., same dopant type as that of the buried resistor) that includes a bulk semiconductor material and optionally an epitaxial semiconductor layer located on a surface of the bulk semiconductor material.

Figure 2A:
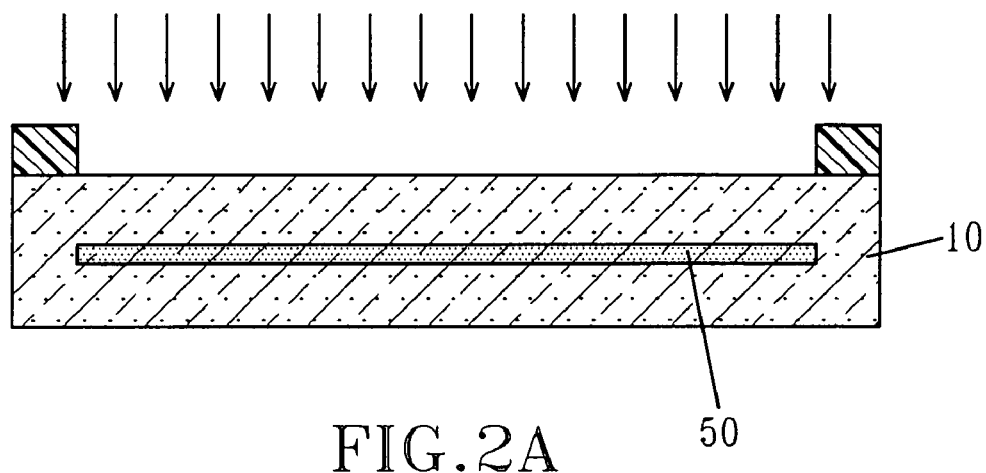
FIGS. 2A-2D are pictorial representations (through cross sectional views) illustrating a second embodiment of the present invention for fabricating a precision buried resistor in a bulk substrate of the same conductivity type.

FIGS. 2A-2D shows this particular embodiment of the present invention. FIG. 2A shows the structure that is formed during implantation of a deep dopant region 50 into a semiconductor substrate 10. The deep dopant region 50 can be either n- or p-type with the proviso that when the substrate is n-type then a deep p-type region is formed, or when the substrate is p-type then a deep n-type region is formed. The deep dopant region 50 provides electrical isolation for the buried resistor 18 (to be subsequently formed). The deep dopant region 50 has an upper surface that is located about 50 nm or greater below the upper surface of substrate 10.

The deep dopant region 50 is formed by first providing an implantation mask on the surface of the structure and then subjecting that mask to lithography. Appropriate dopants of the opposite conductivity type as the substrate 10 are then introduced into the substrate using conventional ion implantation conditions. Specifically, the conditions for ion implanting the deep dopant region 50 into the substrate vary depending upon the type of ions that are used. For p-type dopants, an energy from about 15 to about 1700 keV is utilized, with an energy from about 40 to about 500 keV being more typical. For n-type dopants, an energy from about 60 keV or greater is utilized, with an energy from about 200 to about 1700 keV being more typical. It is noted that any dosage can be used in forming the deep dopant region 50, with a dosage of about $10^{13}$ atoms/cm$^2$ or greater being typically used. After forming the deep dopant region 50, the patterned mask is removed and the dopants within the deep dopant region 50 may be activated by utilizing a conventional activation anneal.

Figure 2B:
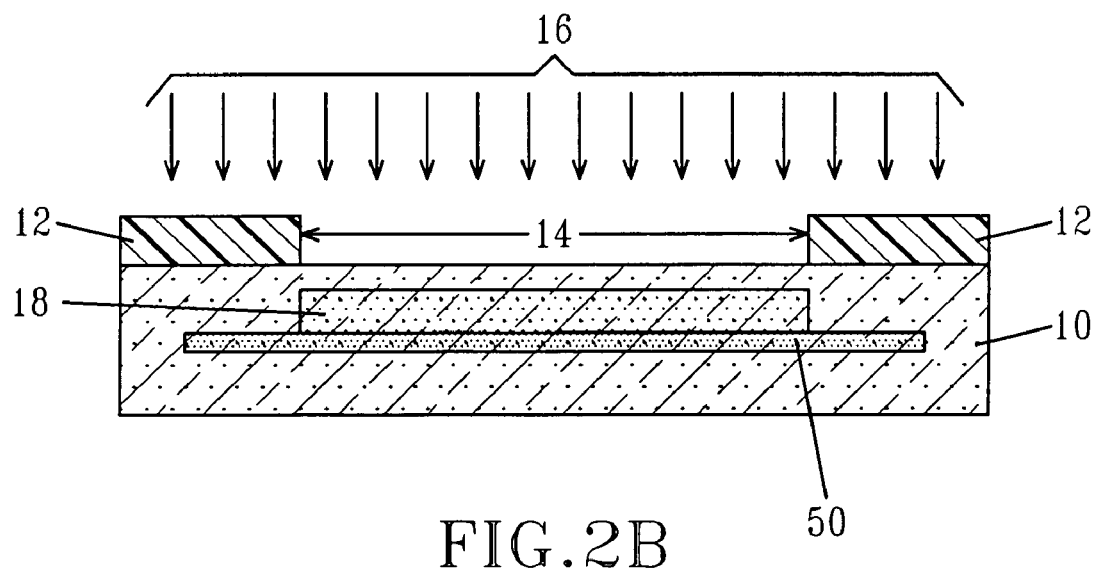

FIG. 2B shows the structure during the formation of the buried resistor 18 into the structure shown in FIG. 2A. As shown, the structure includes the first patterned ion implantation mask 12 having at least one opening 14 in which the dopant ions 16 for the buried resistor 18 are implanted. The processing conditions used in forming this structure are the same as described previously in connection with FIG. 1A. Note that in this embodiment, the buried resistor 18 has a bottom surface that forms an interface with the deep dopant region 50.

Figure 2C:
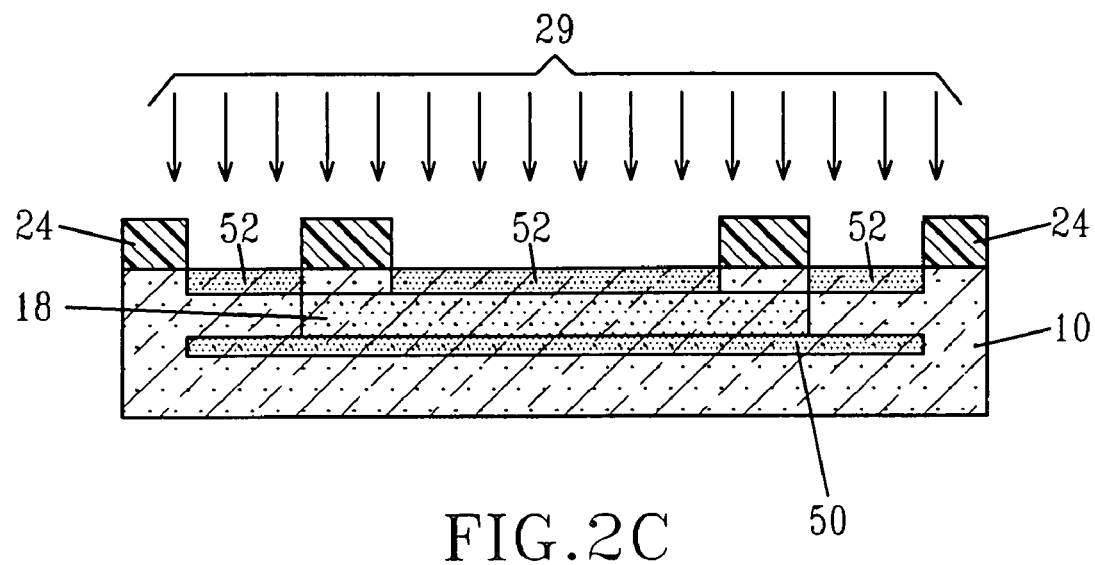

FIG. 2C shows the structure during the formation of the dopant regions 52 that will eventually form well isolation regions 28. Reference numeral 24 denotes the patterned mask used in forming these regions and reference numeral 29 denotes the dopant ions being implanted into the structure. It is noted that the processing conditions used in forming this structure are similar as those previously described above for forming the buried resistor structure except that the dopant concentration is opposite polarity and the ion implant process is effectively lower energy and dosage in order to create shallow lower doped regions.

After forming the structure shown in FIG. 2C, the second patterned ion implantation mask 24 is removed and the structure is annealed to activate the previously implanted dopant ions within the dopant regions 52. In some embodiments, the anneal step is omitted and instead the structure is oxidized and the oxidized material thus formed is removed from the structure utilizing an etching process that selectively removes thermal oxide. The anneal may also be used to heal any damages caused during the previous implants.

Figure 2D:
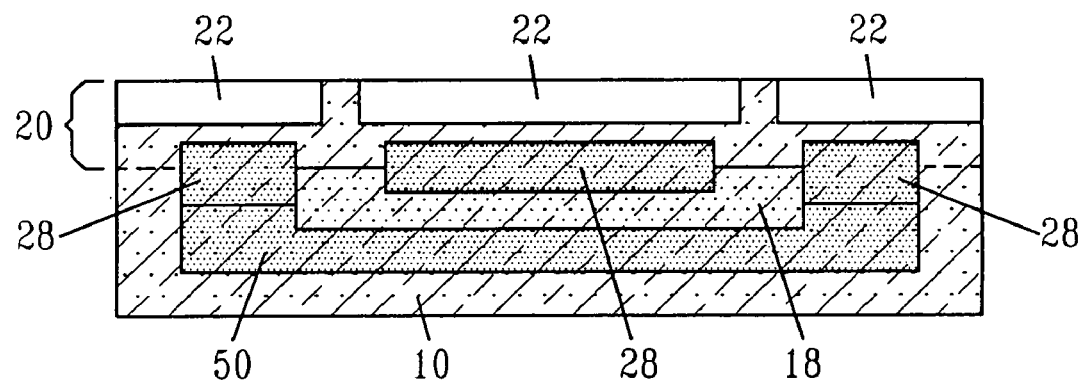

Next, epi layer 20 is formed as described above in connection with FIG. 1C and the isolation regions 22 as described in FIG. 1D are formed providing the structure shown in FIG. 2D. It should be noted that the anneal and epi process cause diffusion of dopants from dopant regions 52 forming well regions 28 as shown in FIG. 2D. The well regions 28 which are located at the edges of the buried resistor 18 and atop the buried resistor 18, together with the deep dopant region 50 out diffusing create isolation substantially around the buried resistor 18.

Conventional CMOS processing can then be preformed to form at least one semiconductor device such as, for example, a FET, a bipolar transistor or a combination thereon on this structure. Likewise resistor reachthrough/sinker well regions can be formed similar to previously described process in FIG. 1E to 1G. These reachthrough/sinker regions provide low resistance electrical contact to each end of the buried resistor 18.

EMBODIMENT III

Buried p- or n-Type Resistor in a p- or n-Type Substrate (Alternative to Embodiment II)

In this embodiment of the present invention, which is an alternative to the second embodiment described above, a buried resistor (p- or n-type) is formed into a semiconductor substrate (p- or n-type, e.g., same dopant type as that of the buried resistor) that includes a bulk semiconductor material and optionally an epitaxial semiconductor layer located on a surface of the bulk semiconductor material. The third embodiment of the present invention is depicted in FIGS. 3A-3E.

Figure 3A:
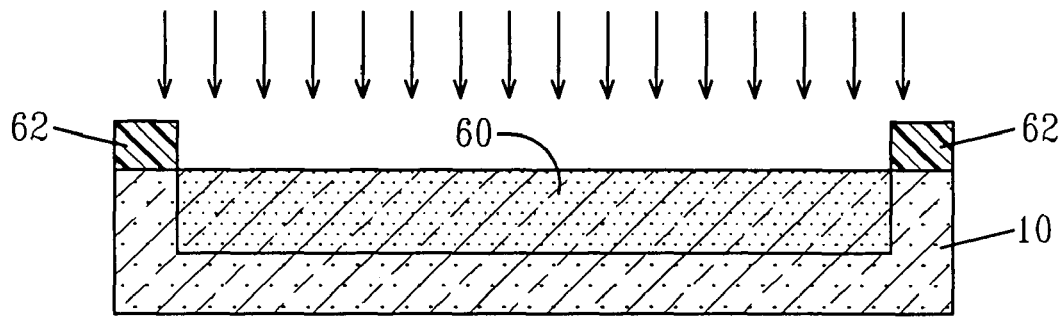
FIGS. 3A-3E are pictorial representations (through cross sectional views) illustrating a third embodiment of the present invention for fabricating a precision buried resistor in a bulk substrate of the same conductivity type.

FIG. 3A illustrates the structure that is formed during the formation of tub region 60 having an opposite conductivity as compared to that of substrate 10. The tub region 60 thus can be an n-type region, when the substrate 10 is p-type, or the tub region 60 can be a p-type region, when the substrate is n-type. The tub region 60 provides isolation from the substrate 10. The tub region 60 is formed to have a concentration that can be overcompensated by the implantation process used in forming the buried resistor 18. Typically, the tub region 60 has a concentration from about $10^{12}$ to about $10^{14}$ atoms/cm$^3$. As shown, a patterned implantation mask 62 is formed on the surface of the substrate 10 prior to the implantation using the techniques described previously herein.

Appropriate dopants of the opposite conductivity type as the substrate 10 are then introduced into the substrate using conventional ion implantation conditions that are capable of forming the tub region 60. Specifically, the conditions for ion implanting the tub region 60 into the substrate 10 vary depending upon the type of ions that are used. For p-type dopants, an energy from about 5 to about 1700 keV is utilized, with an energy from about 15 to about 500 keV being more typical. For n-type dopants, an energy from about 25 keV or greater is utilized, with an energy from about 40 to about 1700 keV being more typical. After forming the tub region 60, the patterned mask 62 is removed and the dopants within the tub region 60 may be activated by utilizing a conventional activation anneal.

Figure 3B:
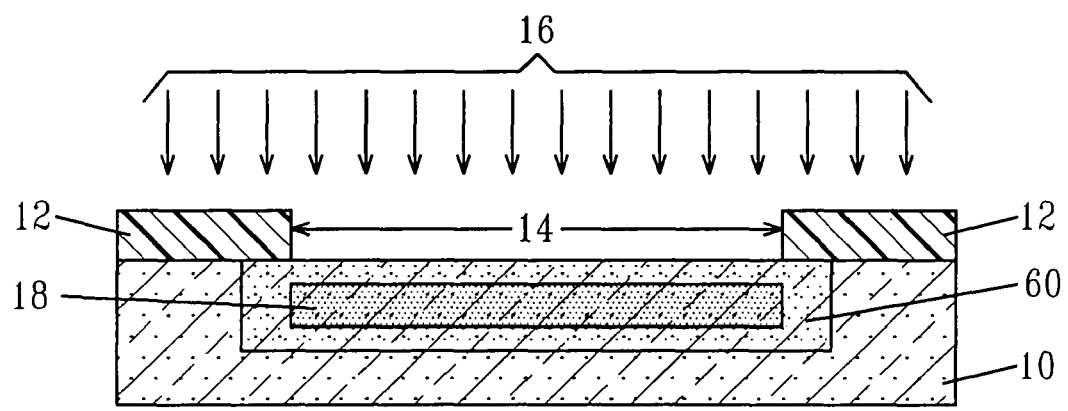
Figure 3C:
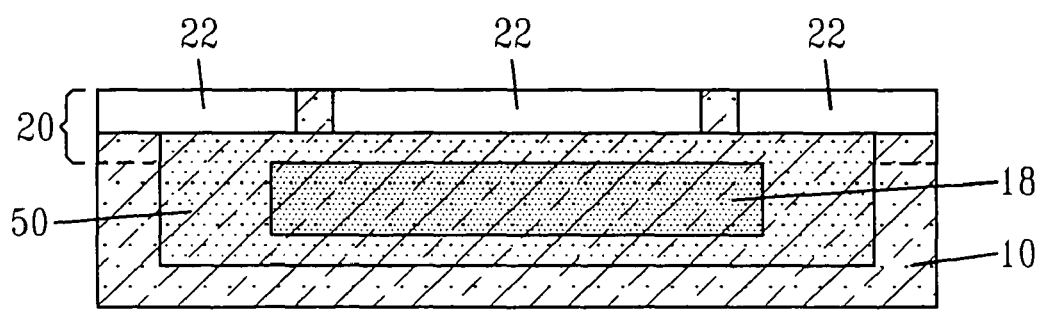

FIG. 3B shows the structure during the formation of the buried resistor 18. The buried resistor 18 has the opposite conductivity as that of the tub region 60. The buried resistor 18 can be formed as described above in FIG. 1A. Note that the buried resistor 18 is positioned within the tub region 60 and, as such, the tub region 60 isolates all surfaces of the buried resistor 18 from the substrate 10.

After forming the buried resistor 18, the patterned ion implantation mask 12 is removed and the structure is annealed to heal any damages caused by the previous implant step. An epi layer 20 and isolation regions 22 are formed utilizing the processing described above in the first embodiment of the present invention. Note during epi growth and annealing, some diffusion of tub region 50 and the buried resistor 18 may occur.

Figure 3D:
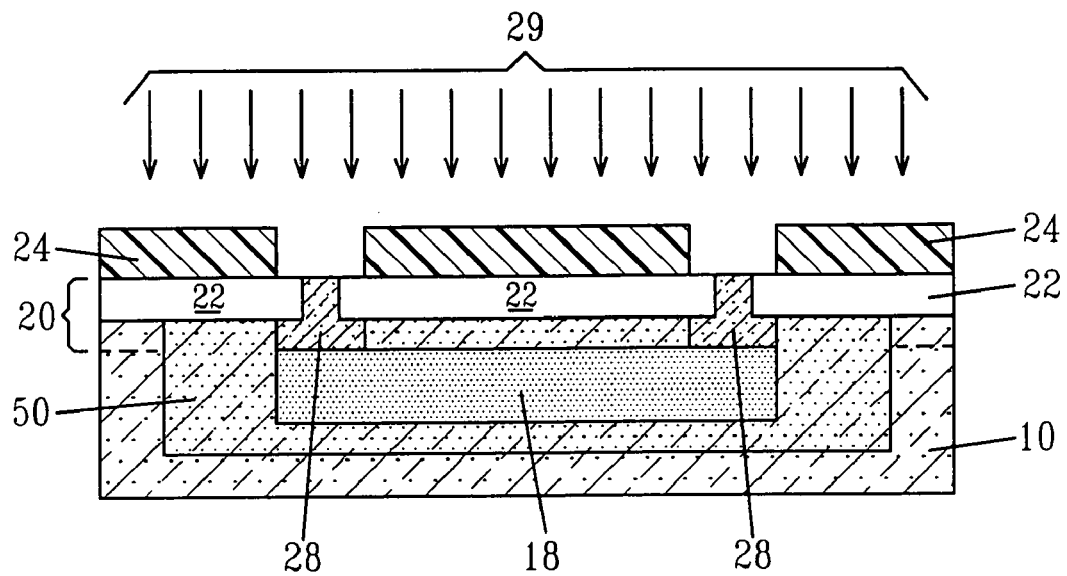
Figure 3E:
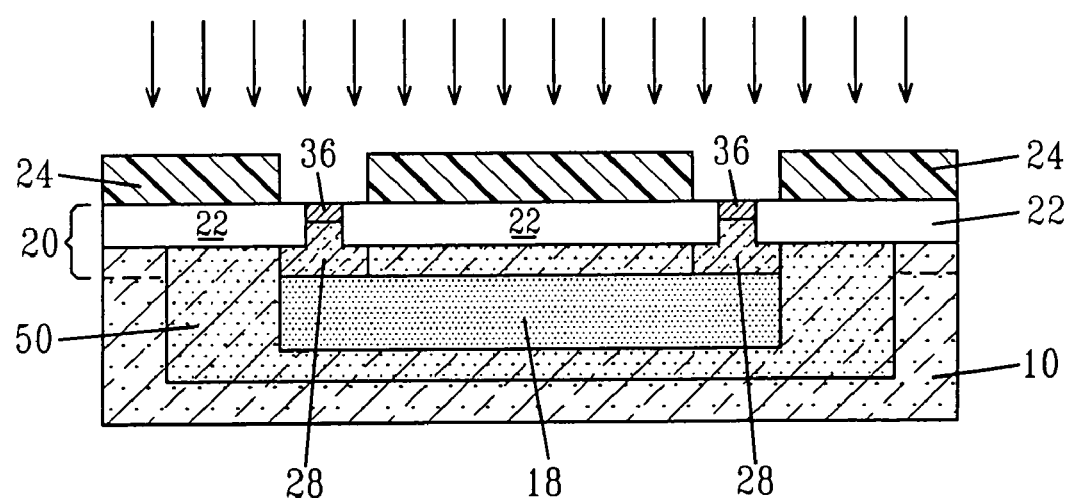

Next, well regions 28 are formed utilizing the second patterned mask 24 and the well ion implantation process as described above in connection with FIG. 1E. The resultant structure after well region 28 formation is shown in FIG. 3D. FIG. 3E shows the structure formed after ohmic contact regions 36 are formed from the FETs source/drain ion implant process with similar conductivity as the of well regions 28.

EMBODIMENT IV

Buried Resistor in SOI

Figure 4A:
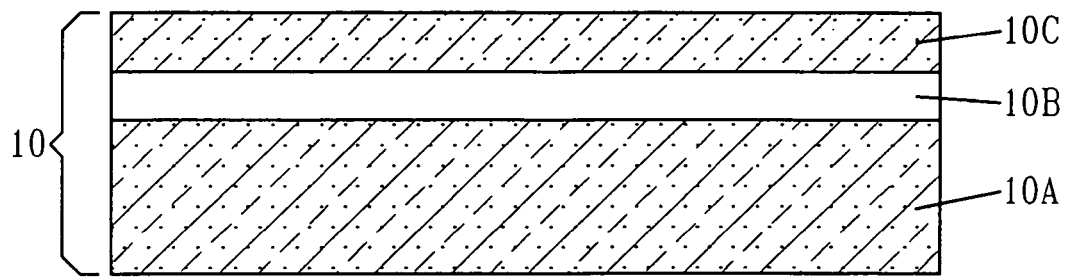
FIGS. 4A-4I are pictorial representations (through cross sectional views) illustrating a fourth embodiment of the present invention for fabricating a precision buried resistor in a semiconductor-on-insulator (SOI) substrate.

In this embodiment, the inventive buried resistor is formed into a region of a bottom semiconductor layer of an SOI substrate and the well regions are located in a top semiconductor layer of the SOI substrate. This embodiment begins by first providing the SOI substrate 10 shown in FIG. 4A. The SOI substrate includes a buried insulating layer 10B, separating top and bottom semiconductor layers 10C and 10A, respectively. The SOI substrate 10 can be formed by conventional techniques which are well known in the art. For example, the SOI substrate 10 can be formed by a layer transfer process including a step of bonding two semiconductor wafers together. Alternatively, the SOI substrate can be formed by a SIMOX process, i.e., separation by ion implantation of oxygen.

Figure 4B:
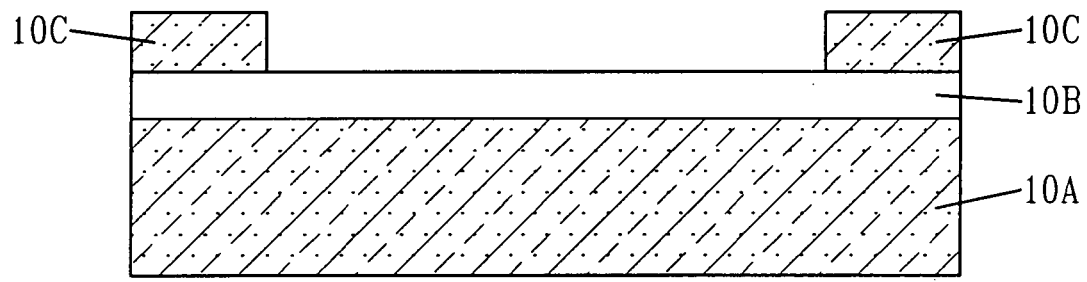

FIG. 4B shows the SOI substrate 10 after the top semiconductor layer 10C has been patterned. Patterning is achieved by applying a photoresist to the surface of the top semiconductor layer 10C, performing a conventional lithographic step and then selectively etching the exposed portions of the top semiconductor layer 10C.

Figure 4C:
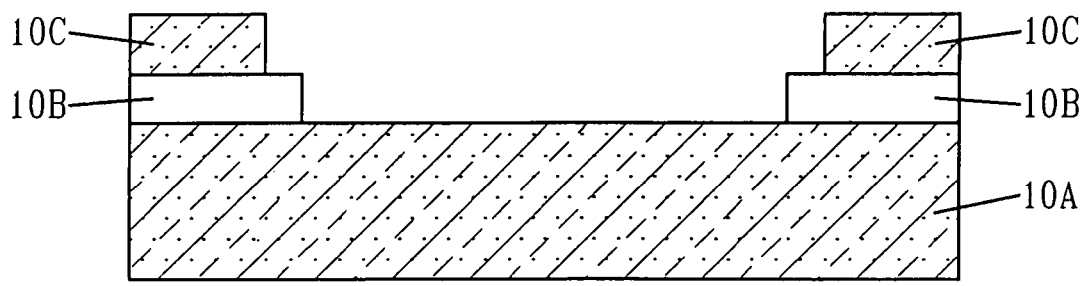

Next, all or part of the exposed buried insulting layer 10B can be removed from the structure providing the structure shown in FIG. 4C. A wet etching process that is selective for removing the exposed portion of the buried insulating can be used. This can be performed without an ion implantation mask or with an ion implantation mask 70 as shown in FIG. 4D.

Figure 4D:
Figure 4E:
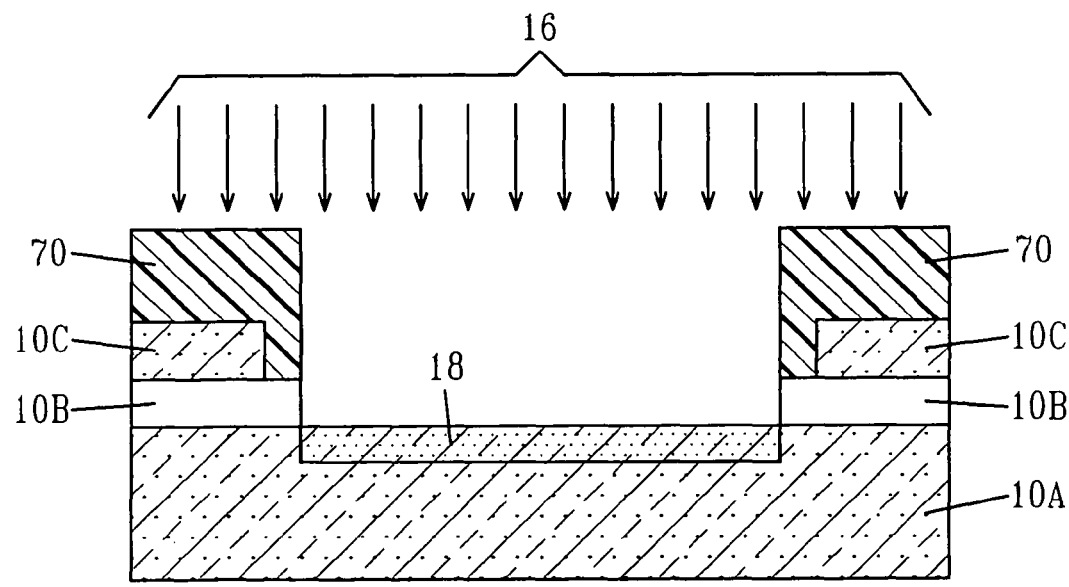
Figure 4F:
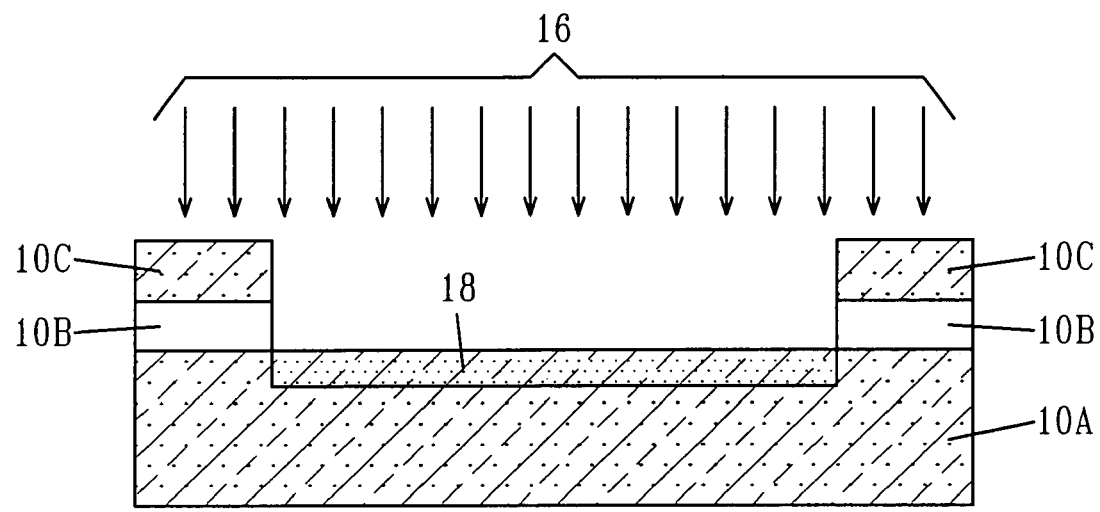

FIGS. 4E and 4F shows the structure of FIGS. 4C and 4D, respectively after buried resistor 18 has been formed into the bottom semiconductor layer 10A of the SOI. The buried resistor 18 is formed as described above in the first embodiment of the present invention. Note that the buried resistor 18 will contain edge portions that are substantially aligned to the edges of the patterned top semiconductor/insulating layer or the mask 70.

Figure 4G:
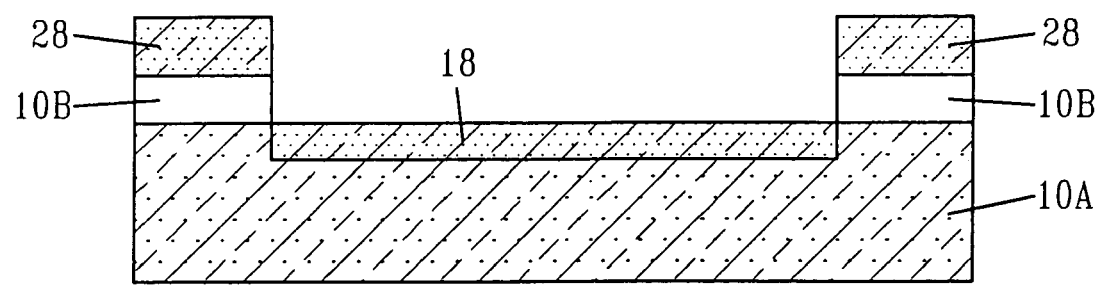

At this point of the present invention a standard front of the line process is performed on either the structures shown in FIGS. 4E and 4F including the formation of a well region 28 into remaining portions of the top semiconductor layer 10C of the SOI substrate 10. This structure, including the well region 28, is shown in FIG. 4G. For clarity, the structure shown in FIG. 4E is used in forming the structure shown in FIG. 4G. Likewise all or most of the front end of the line processing of the FETs, bipolar transistors, or passive devices such as polysilicon resistors, capacitors or diodes could be completed prior to the buried resistor process. This would be beneficial since it would eliminate the impact of the non-planarity that the buried resistor process would create on the SOI substrate for any critical lithography or processing steps of said devices.

Figure 4H:
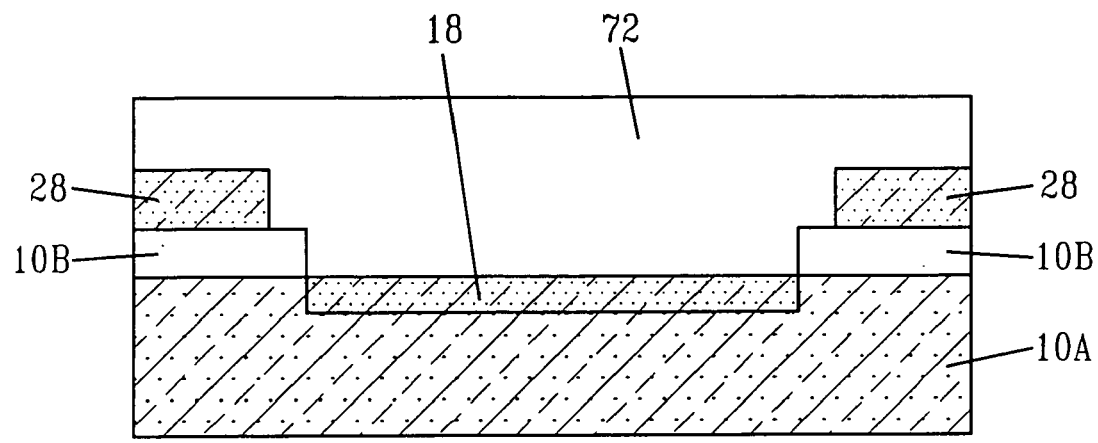
Figure 4I:
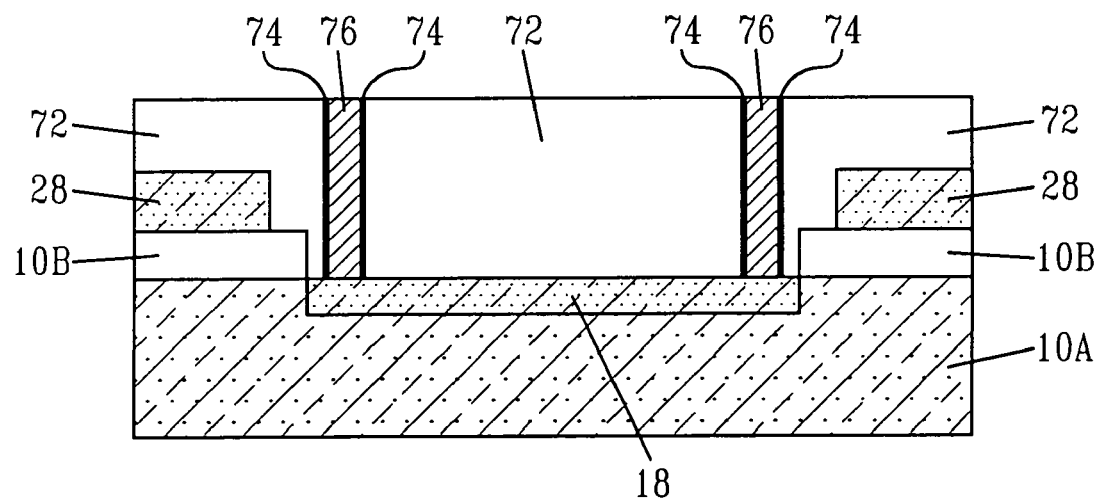

Next, and as shown in FIG. 4H, a dielectric material 72 such as boron phosphorous doped silicate glass, $SiO_2$, or an organosilicate glass, is formed on the structure shown in FIG. 4G utilizing a conventional deposition process such as, for example, spin-on coating, CVD, and PECVD. The dielectric is the patterned utilizing a conventional lithographic process to provide contact openings that expose portions of the substrate including the buried resistor 18. The contact openings can then be optionally lined with a silicide such as Ni—Si and then filled with a conductive material such as W, Cu, Al or alloys thereof. FIG. 4I shows this resultant structure where reference numeral 74 is the silicide liner and reference numeral 76 is the conductive material filling the contact openings.

In some embodiments, the buried resistor 18 is isolated from the substrate 10 by forming a tub region as described above in the third embodiment of the present invention.

Figure 5:
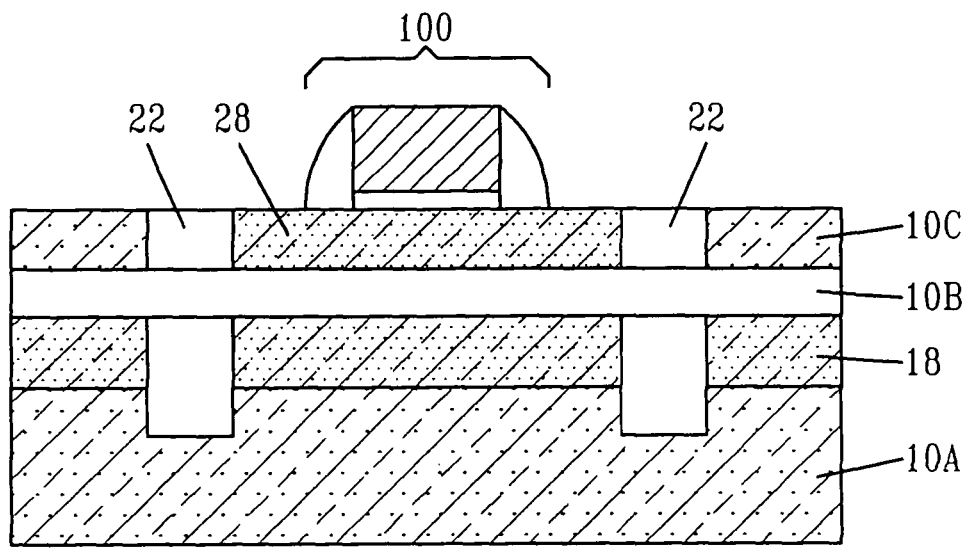
FIG. 5 is pictorial representation (through a cross sectional view) illustrating a semiconductor structure including the inventive buried resistor located in the bottom semiconductor layer of a semiconductor-on-insulator (SOI) substrate, a well region located in a top semiconductor layer of the SOI substrate, and a FET located on the upper surface of the top semiconductor layer.

FIG. 5 is pictorial representation (through cross sectional view) illustrating a semiconductor structure including the inventive buried resistor 18 located in the bottom semiconductor layer 10A of a semiconductor-on-insulator (SOI) substrate 10, a well region 28 located in a top semiconductor layer 10C of the SOI substrate 10, and a FET 100 located on the upper surface of the semiconductor layer 10C. This structure is formed utilizing the processing steps described in one of the embodiments above and conventional CMOS processing.

Figure 6:
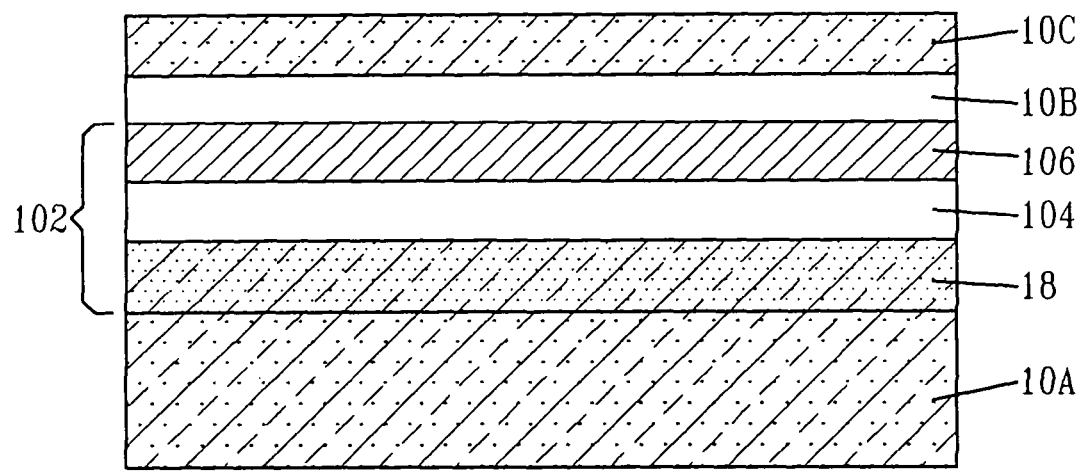
FIG. 6 is a pictorial representation (through a cross sectional view) showing a semiconductor structure including the inventive buried resistor as the bottom plate electrode of a metal-insulator-metal (MIM) capacitor formed from the buried oxide region used in a SOI substrate.

FIG. 6 is a pictorial representation (through a cross sectional view) showing a semiconductor structure including the inventive buried resistor 18 as the bottom plate electrode of a metal-insulator-metal (MIM) capacitor 102. In addition to the inventive buried resistor 18 as the bottom plate electrode of the MIM capacitor 102, the MIM capacitor 10 also includes a MIM cap dielectric 104 and a top plate electrode 106. The MIM cap dielectric 104 includes a conventional dielectric material such as silicon dioxide or silicon nitride, while the top plate electrode 106 comprises a doped polySi, doped polySiGe, or a conductive metal. The structure shown in FIG. 6 is formed utilizing the processing steps described in one of the embodiments described above and conventional MIM capacitor processing. Likewise one could utilize the dielectric layer utilize in the bulk SOI substrate as the dielectric material for the MIM capacitor and a highly doped well region as the top plate formed in the top silicon surface of the SOI substrate.

While the present invention has been particularly shown and described with respect to preferred embodiments thereof, it will be understood by those skilled in the art that the foregoing changes in forms and details may be made without departing from the spirit and scope of the present application. It is therefore intended that the present invention not be limited to the exact forms and details described and illustrated herein, but fall within the scope of the appended claims.

What is claimed is:

1. A method of fabricating a semiconductor structure comprising:

forming a patterned ion implantation mask on a surface of a semiconductor substrate, said patterned ion implantation mask having an opening that exposes a region of the semiconductor substrate;

forming a buried resistor following the formation of the ion implantation mask by ion implantation, the buried resistor is present beneath the surface of the semiconductor substrate and in said exposed region of the semiconductor substrate;

removing said patterned ion implantation mask following the forming of the buried resistor;

annealing said semiconductor substrate after removing the patterned ion implantation mask to at least heal damages in said semiconductor substrate above said buried resistor caused during said ion implantation;

forming an epitaxial semiconductor layer on an upper surface of the semiconductor substrate following the annealing;

forming isolation regions within the epitaxial semiconductor layer; and forming a first well region and a second well region in said semiconductor substrate and said epitaxial semiconductor layer in contact with an upper surface of said buried resistor, wherein the first well region is in contact with a first end of the buried resistor and the second well region is in contact with an opposing second end of the buried resistor, wherein said buried resistor has a sheet resistance tolerance of less than 10%.

2. The method of claim 1 wherein said forming the buried resistor comprises ion implanting a p-type dopant into said substrate and said forming said first and second well regions comprises ion implanting the p-type dopant into said substrate.

3. The method of claim 1 wherein said forming the buried resistor comprises ion implanting an n-type dopant into said substrate and said forming said first and second well regions comprises ion implanting an n-type dopant into said substrate.

4. The method of claim 1 further comprising forming a tub region around said buried resistor such that said buried resistor is isolated from said substrate.

5. The method of claim 1 wherein said forming said buried resistor comprises a deep ion implantation process and said forming said first and second well regions comprises a shallow ion implantation process.

6. The method of claim 1 wherein said substrate is a bulk semiconductor substrate wherein an epitaxial layer is formed atop said substrate after forming said buried resistor.

7. The method of claim 1 further comprising at least one field effect transistor atop said substrate.

8. The method of claim 1 wherein said buried resistor comprises a bottom electrode of a metal-insulator-metal (MIM) capacitor, and steps of forming a MIM cap dielectric and forming a top electrode are performed prior to forming said well region.

9. The method of claim 1 wherein said buried resistor comprises a bottom electrode of a metal-insulator-metal (MIM) capacitor, and steps of forming a MIM cap dielectric and forming a top electrode are performed after forming said well region.

10. The method of claim 1 further comprising forming a third well region above the buried resistor between the first and second well regions, in which the third well region has an opposite conductivity type than the first and second well regions and the buried resistor.

* * * * *